(12) United States Patent　　　　(10) Patent No.:　US 12,652,880 B2
Kuo et al.　　　　　　　　　　　　(45) Date of Patent:　　　Jun. 9, 2026

(54) OPTICAL DEVICE

(71) Applicant: VisEra Technologies Company Ltd.,
Hsin-Chu City (TW)

(72) Inventors: Shin-Hong Kuo, Hsin-Chu City (TW);
Kai-Hao Chang, Hsin-Chu City (TW);
Po-Hsiang Wang, Hsin-Chu City (TW);
Han-Lin Wu, Hsin-Chu City (TW);
Hung-Jen Tsai, Hsin-Chu City (TW)

(73) Assignee: VisEra Technologies Company Ltd.,
Hsin-Chu City (TW)

( * ) Notice: Subject to any disclaimer, the term of this
patent is extended or adjusted under 35
U.S.C. 154(b) by 487 days.

(21) Appl. No.: 18/187,484

(22) Filed: Mar. 21, 2023

(65) Prior Publication Data

US 2024/0322056 A1　　Sep. 26, 2024

(51) Int. Cl.
H10F 77/14　　　　(2025.01)
H10F 19/00　　　　(2025.01)
H10F 77/12　　　　(2025.01)

(52) U.S. Cl.
CPC ............. H10F 77/14 (2025.01); H10F 19/00
(2025.01); H10F 77/12 (2025.01)

(58) Field of Classification Search
CPC .......... H10F 77/14; H10F 19/00; H10F 77/12;
H10F 77/413; H10F 39/182; H10F
39/805; H10F 39/8053; H10F 39/806;
H10F 39/8063; H10F 39/8067; H10F
39/807
See application file for complete search history.

(56) References Cited

U.S. PATENT DOCUMENTS

| | | | | |
|---|---|---|---|---|
| 9,564,469 | B2 * | 2/2017 | Kim | H10F 39/806 |
| 2007/0298533 | A1 * | 12/2007 | Yang | G02B 5/1871 |
| | | | | 438/57 |
| 2011/0308590 | A1 * | 12/2011 | Asami | H10F 77/146 |
| | | | | 977/762 |
| 2015/0214262 | A1 * | 7/2015 | Kim | H10F 39/8063 |
| | | | | 438/70 |
| 2016/0126277 | A1 * | 5/2016 | Kim | H10F 39/8053 |
| | | | | 438/70 |
| 2017/0004342 | A1 * | 1/2017 | Rommel | G06V 40/1306 |
| 2020/0076999 | A1 * | 3/2020 | Akiyama | H10F 39/812 |
| 2021/0091130 | A1 * | 3/2021 | Bonakdar | H10F 39/8053 |
| 2021/0126029 | A1 * | 4/2021 | Roh | H10F 39/156 |
| 2021/0126035 | A1 * | 4/2021 | Roh | G02B 3/0056 |

(Continued)

FOREIGN PATENT DOCUMENTS

| | | |
|---|---|---|
| EP | 3993047 A | 5/2022 |
| JP | 2019192705 A | 10/2019 |

(Continued)

*Primary Examiner* — Bitew A Dinke
(74) *Attorney, Agent, or Firm* — LIU & LIU

(57)　　　　　ABSTRACT

An optical device includes a photoelectric conversion layer,
an underlying layer, an anti-reflection layer, and a plurality
of meta units. The underlying layer is disposed on the
photoelectric conversion layer. The anti-reflection layer is
disposed on the underlying layer. The meta units are dis-
posed above the photoelectric conversion layer, in which
each of the meta units includes a top portion and a bottom
portion, and a projection of the bottom portion on the
photoelectric conversion layer is within a projection of the
top portion on the photoelectric conversion layer.

20 Claims, 14 Drawing Sheets

(56)         References Cited

U.S. PATENT DOCUMENTS

| | | | |
|---|---|---|---|
| 2021/0249459 A1* | 8/2021 | Yun | H10F 39/8053 |
| 2021/0366964 A1* | 11/2021 | Ito | H10F 39/8053 |
| 2022/0137423 A1* | 5/2022 | Yun | H04N 25/133 |
| | | | 348/272 |
| 2022/0155150 A1* | 5/2022 | Tappura | G01J 5/046 |
| 2022/0221741 A1 | 7/2022 | Park et al. | |
| 2023/0044716 A1 | 2/2023 | Han et al. | |
| 2023/0154958 A1* | 5/2023 | Kim | H10F 39/805 |
| | | | 257/432 |
| 2023/0170365 A1* | 6/2023 | Lee | H10F 39/8053 |
| | | | 250/208.1 |
| 2023/0176391 A1* | 6/2023 | Kim | G02B 27/1013 |
| | | | 348/302 |
| 2024/0137474 A1* | 4/2024 | Lee | H04N 25/13 |
| 2024/0170522 A1* | 5/2024 | Choi | H10F 39/806 |
| 2024/0194711 A1* | 6/2024 | Wang | H10F 39/806 |
| 2024/0321919 A1* | 9/2024 | Hoshi | H10F 39/8053 |
| 2025/0089385 A1* | 3/2025 | Motokubota | H10F 39/8057 |
| 2025/0120205 A1* | 4/2025 | Noudo | H10F 39/014 |
| 2025/0204064 A1* | 6/2025 | Takahashi | H10F 39/8053 |

FOREIGN PATENT DOCUMENTS

| | | | |
|---|---|---|---|
| WO | 2020193857 A | 10/2020 | |
| WO | 2023013393 A | 2/2023 | |
| WO | 2023013444 A | 2/2023 | |
| WO | 2023013521 A | 2/2023 | |

\* cited by examiner

TP

BP

150h

D1

D3

D2

TP

BP

150j

D1

D3

D2

TP

BP

150g

D1

D3

D2

TP

BP

150i

D1

D3

D2

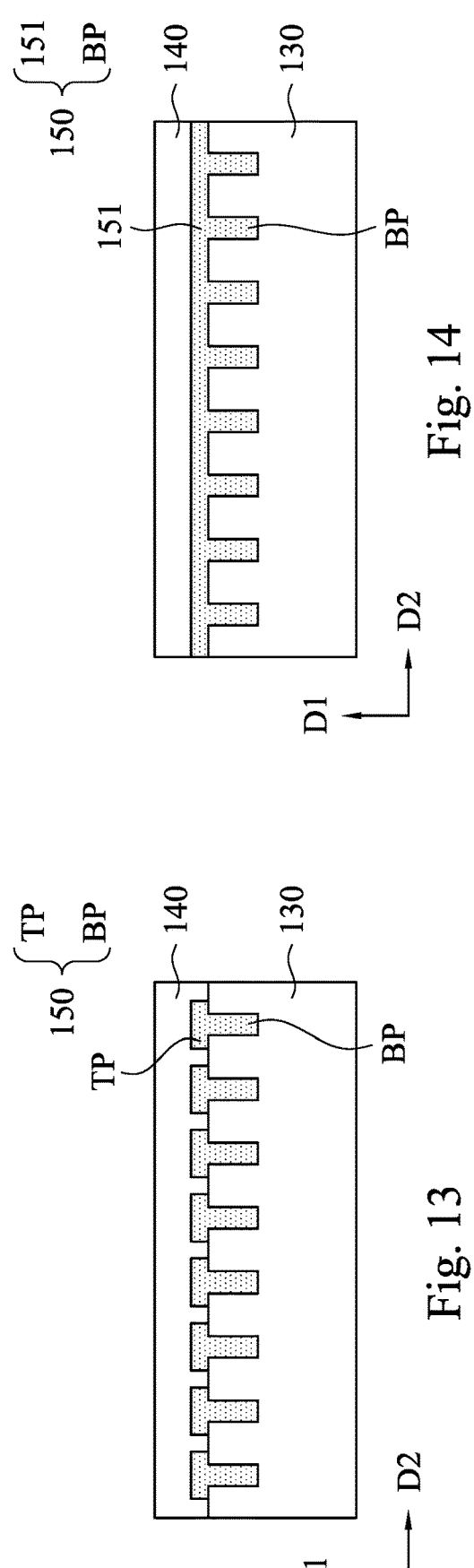
Fig. 14
Fig. 13
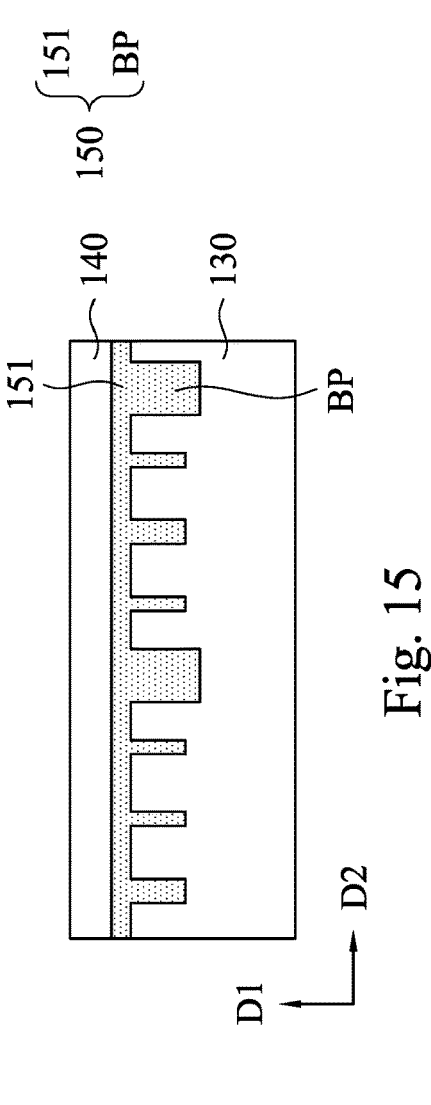
Fig. 15

OPTICAL DEVICE

BACKGROUND

Field of Invention

The present disclosure relates to an optical device. More particularly, the present disclosure relates to an optical device having T-shaped meta units.

Description of Related Art

In the field of complementary metal oxide semiconductor (CMOS) image sensors (also could be referred to as CIS), focal lengths and optical aberrations in an optical device could affect the image performance. Focal lengths of light may cause the size of the optical device. If the light with different wavelengths would not be properly tuned, the image performance may be poor. Therefore, there is a need to improve the image performance of the optical device.

SUMMARY

The present disclosure provides various optical devices having a plurality of meta units. The meta units are embedded in each of the optical devices. Each of the meta units has a top portion and a bottom portion, and a surface area of the top portion is greater than a surface area of the bottom portion. The meta units of the present disclosure could provide better optical aberrations and improve the image performance of the optical devices.

One aspect of the present disclosure is to provide an optical device. The optical device includes a photoelectric conversion layer, an underlying layer, an anti-reflection layer, and a plurality of meta units. The underlying layer is disposed on the photoelectric conversion layer. The anti-reflection layer is disposed on the underlying layer. The meta units are disposed above the photoelectric conversion layer, in which each of the meta units includes a top portion and a bottom portion, and a projection of the bottom portion on the photoelectric conversion layer is within a projection of the top portion on the photoelectric conversion layer.

According to some embodiments of the present disclosure, the top portion of each of the plurality of meta units is embedded in the anti-reflection layer and the bottom portion of each of the plurality of meta units is embedded in the underlying layer.

According to some embodiments of the present disclosure, a shape of the top portion of each of the plurality of meta units includes a rectangle in a side view, a shape of the bottom portion of each of the plurality of meta units includes a rectangle in a side view, and a top width of the top portion is greater than a bottom width of the bottom portion.

According to some embodiments of the present disclosure, projections of each of the plurality of meta units on the photoelectric conversion layer are spaced apart from each other.

According to some embodiments of the present disclosure, the top portions of the plurality of meta units are connected together to form a continuous top portion.

According to some embodiments of the present disclosure, a top height of the top portion of each of the plurality of meta units is less than a bottom height of the bottom portion of each of the plurality of meta units.

According to some embodiments of the present disclosure, a shape of each of the plurality of meta units includes a round, a square, or a rectangle in a top view, and a shape of the top portion of each of the plurality of meta units includes a rectangle or a trapezoid in a side view.

According to some embodiments of the present disclosure, a shape of each of the plurality of meta units includes a T-shape or a cross-shape in a top view, and a shape of the top portion of each of the plurality of meta units includes a trapezoid in a side view.

According to some embodiments of the present disclosure, a shape of the top portion of each of the plurality of meta units includes a trapezoid in a side view, a first top width of the trapezoid is less than a second top width of the trapezoid, and a bottom angle of the trapezoid in a range from 30 degrees to 90 degrees.

According to some embodiments of the present disclosure, a shape of the top portion of each of the plurality of meta units includes a trapezoid in a side view, a first top width of the trapezoid is greater than a second top width of the trapezoid, and a bottom angle of the trapezoid in a range from 90 degrees to 135 degrees.

According to some embodiments of the present disclosure, the photoelectric conversion layer includes a first photodiode, a second photodiode, and a deep trench isolation disposed between the first photodiode and the second photodiode, the meta units include a first meta unit disposed above the first photodiode, a second meta unit disposed above the second photodiode, and a third meta unit disposed above the deep trench isolation, and a size of the first meta unit, a size of the second meta unit, and a size of the third meta unit are different from each other.

According to some embodiments of the present disclosure, the meta units is made of two-dimensional transition metal dichalcogenides, $ZrO_2$, $TiO_2$, $Si_xN_y$, ITO, Si, a-Si, p-Si, a III-V semiconductor compound, or combinations thereof, wherein x and y are positive integers, x is in a range from 1 to 3, and y is in a range from 1 to 4.

According to some embodiments of the present disclosure, the plurality of meta units are arranged in two layers or three layers, and a bottommost layer of the meta units is completely embedded in the underlying layer.

According to some embodiments of the present disclosure, the plurality of meta units are arranged in a form of a matrix array, a polygonal array, a concentric circle, or random.

According to some embodiments of the present disclosure, the optical device further includes a color filter layer disposed between the photoelectric conversion layer and the underlying layer, wherein the top portion of each of the plurality of meta units is embedded in the anti-reflection layer and the bottom portion of each of the plurality of meta units is embedded in the underlying layer.

According to some embodiments of the present disclosure, the optical device further includes, wherein a bottom surface of each of the plurality of meta units contacts a top surface of the color filter layer.

According to some embodiments of the present disclosure, the optical device further includes a color filter layer disposed between the photoelectric conversion layer and the underlying layer, wherein the color filter layer includes a plurality of grids and a plurality of color filters, and a projection of the plurality of meta units on the photoelectric conversion layer partially overlaps a projection of the plurality of grids on the photoelectric conversion layer.

According to some embodiments of the present disclosure, the optical device further includes a color filter layer disposed between the photoelectric conversion layer and the underlying layer, wherein the plurality of meta units are embedded in the color filter layer.

According to some embodiments of the present disclosure, the optical device further includes a color filter layer disposed between the photoelectric conversion layer and the underlying layer, wherein the color filter layer includes a plurality of grids and a plurality of color filters, and a projection of the plurality of meta units on the photoelectric conversion layer is spaced apart from a projection of the plurality of grids on the photoelectric conversion layer.

According to some embodiments of the present disclosure, a refractive index of the plurality of meta units is greater than a refractive index of the underlying layer, and the refractive index of the underlying layer is greater than a refractive index of the anti-reflection layer, wherein the refractive index of the plurality of meta units is in a range from 1.4 to 6.5.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 to FIG. 17 are cross-sectional views of arrangements of meta units according to alternative embodiments of the present disclosure.

DETAILED DESCRIPTION

Figure 1:
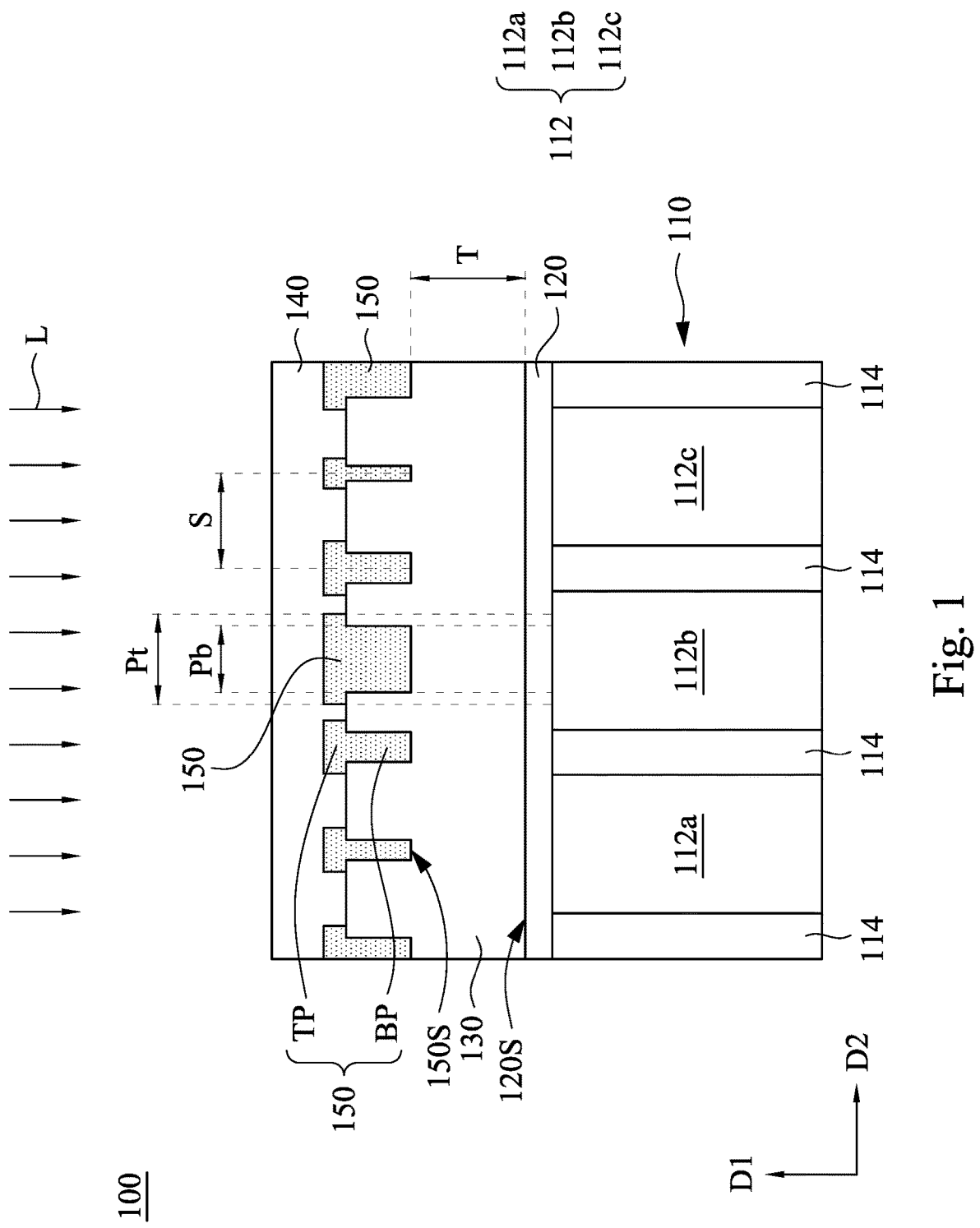
FIG. 1 is a cross-sectional view of an optical device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of an optical device 100 in accordance with some embodiments of the present disclosure. The optical device 100 includes a photoelectric conversion layer 110, a buffer layer 120, an underlying layer 130, an anti-reflection (ARC) layer 140, and a plurality of meta units 150. The photoelectric conversion layer 110 includes a plurality of photodiodes 112 (including photodiodes 112*a*, 112*b*, 112*c*) and a plurality of deep trench isolations (DTIs) 114 separating each of the photodiodes 112. The photodiodes 112 are configured to detect an external light (such as a light L). The buffer layer 120 is disposed on the photoelectric conversion layer 110. In some embodiments, the buffer layer 120 may include an organic material or an inorganic material. The buffer layer 120 is configured to reduce reflection of silicon. The underlying layer 130 is disposed on the buffer layer 120. In some embodiments, the underlying layer 130 may include a material of resin, polyimide, acrylate, poly-vinyl alcohol, or photoresist. the anti-reflection layer 140 is disposed on the underlying layer 130 and is configured to avoid reflection. In some embodiments, the anti-reflection layer 140 may include an organic multi-film material or an inorganic multi-film material, such as $SiO_2$, SiH, $TiO_2$, $Ti_3O_5$, $Ta_2O_5$, $MgF_2$, $Al_2O_3$, $ZrO_2$, or other suitable material. In some embodiments, the anti-reflection layer 140 may include a plurality of micro-structures, such as moth-eye micro-structures.

As shown in FIG. 1, the meta units 150 are disposed above the photoelectric conversion layer 110. Specifically, the meta units 150 are embedded in the underlying layer 130 and the anti-reflection layer 140. Each of the meta units 150 is spaced from each other. The meta units 150 are extend along a first direction D1 and disposed along a second direction D2 substantially perpendicular to the first direction D1. The plurality of meta units 150 form a "meta layer." The meta units 150 could produce optical functions of light gathering, light splitting, scattering, filtering, refraction and reflection according to the shapes and arrangements of the meta units 150. The meta units 150 are used for imaging functions to focus, defocus, or correct optical aberrations of light L. In some embodiments, the meta units 150 may be made of two-dimensional transition metal dichalcogenides (2D TMDs), $ZrO_2$, $TiO_2$, $Si_xN_y$ (wherein x and y are positive integers, x is in a range from 1 to 3, and y is in a range from 1 to 4), ITO, Si, a-Si, p-Si, a III-V semiconductor compound, or combinations thereof.

Please refer to FIG. 1. A thickness T of the underlying layer 130 is defined by a bottom surface 150S of each of the meta units 150 to a top surface of the 120S of the buffer layer 120. The thickness T of the underlying layer 130 may be determined by a focal length of the light L after the light L passes through the anti-reflection layer 140 and the meta units 150. The focal length of the light L is related to the design and the arrangement of the different meta units 150. In some embodiments, the thickness T of the underlying layer 130 may be in a range from 0 nm to 4000 nm, such as 500, 1000, 1300, 1800, 2500, 3000, or 3500 nm. If the thickness T of the underlying layer 130 is greater than 4000 nm, it may not have a positive impact on the image performance of the optical device 100.

Figure 2B:
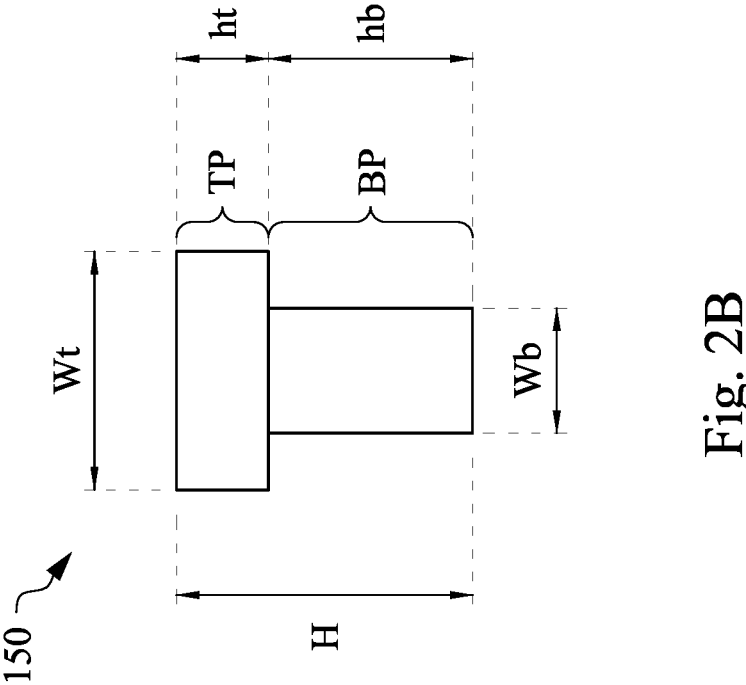
FIG. 2B is a side view of the meta unit of FIG. 2A.
Figure 2A:
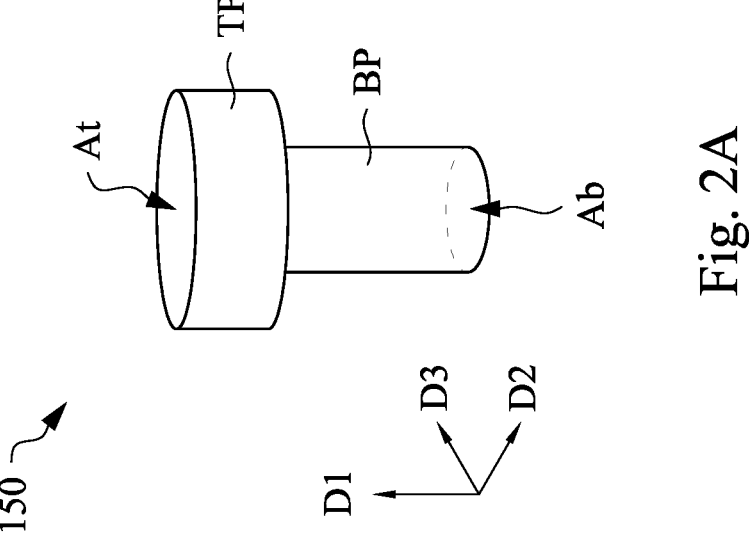
FIG. 2A is a three-dimensional view of a meta unit in the optical device of FIG. 1.

FIG. 2A is a three-dimensional view of the meta unit 150 in the optical device 100 of FIG. 1. The meta unit 150 includes a top portion TP and a bottom portion BP connected to the top portion TP. Both the top portion TP and the bottom portion BP extend along the first direction D1. In some embodiments, the top portion TP continuously extends along the first direction D1 to directly contact the bottom portion BP. A surface area At of the top portion TP is greater than a surface area of the bottom portion BP. The material of the top portion TP is the same as the material of the bottom portion BP. As shown in FIG. 2A, the shape of the meta unit 150 is round in a top view or a bottom view (a D2-D3 plane, in which a direction D3 is substantially perpendicular to the direction D1 and the direction D2). Referring to FIG. 1, the top portion TP of each of the meta units 150 is embedded in the anti-reflection layer 140 and the bottom portion BP of each of the meta units 150 is embedded in the underlying layer 130.

FIG. 2B is a side view of the meta unit 150 of FIG. 2A. The meta unit 150 has a T-shaped structure. In some embodiments, an overall height H of the meta unit 150 is in a range from 0.05 μm to 5 μm, such as 1, 2.5, 3.5, or 4.5 μm. In some embodiments, a top height ht of the top portion TP is different from a bottom height hb of the bottom portion BP. In some embodiments, the top height ht of the top portion TP is less than the bottom height hb of the bottom portion BP. In some embodiments, a specific value of the top height ht to the bottom height hb is in a range from 1/20 to 1, such as 1/15, 1/10, 1/5, 1/4, or 1/2. In some embodiments, if the specific value is less than 1/5 or 1/4, it may not have a positive impact on the image performance of the optical device 100. As shown in FIG. 2B, a shape of the top portion TP of each of the meta units 150 includes a rectangle in a side view, a shape of the bottom portion BP of each of the meta units 150 includes a rectangle in a side view. In some embodiments, a top width Wt of the top portion TP is greater than a bottom width Wb of the bottom portion BP. In some embodiments, the top width Wt is in a range from 40 nm to 850 nm. In some embodiments, the bottom width Wb is in a range from 20 nm to 800 nm. It is understood that the size of the meta unit 150 could be adjusted according to the design and requirements of the optical device 100.

Please refer to FIG. 1 and FIG. 2B, the top portion TP of the meta unit 150 is embedded in a lower portion of the anti-reflection layer 140, and the bottom portion BP of the meta unit 150 is embedded in an upper portion of the underlying layer 130. Please refer to FIG. 1 and FIG. 2A, since the surface area At of the top portion TP is greater than the surface area of the bottom portion BP, a projection Pb of the bottom portion BP on the photoelectric conversion layer 110 is within a projection Pt of the top portion TP on the photoelectric conversion layer 110. In other words, the projection Pb is smaller than the projection Pt. It is understood that each of the meta units 150 illustrated in FIG. 1 has a projection Pb of the bottom portion BP on the photoelectric conversion layer 110 and a projection Pt of the top portion TP on the photoelectric conversion layer 110, in which the projections Pb of different meta units 150 are spaced apart from each other and the projections Pt of different meta units 150 are spaced apart from each other.

In some embodiments, a refractive index of the meta units 150 is greater than a refractive index of the underlying layer 130, and the refractive index of the underlying layer 130 is greater than a refractive index of the anti-reflection layer 140. When a light L including different wavelengths propagates to the optical device 100, energy resonances would occurs in the meta units 150. Specifically, since the meta units 150 has a relative higher refractive index compared to a refractive index of the anti-reflection layer 140 and a refractive index of the underlying layer 130, the light L could be tuned by the energy resonances in the meta units 150. More specifically, since the energy resonances occur in the meta units 150, a refraction angle of the light L having a long wavelength (such as a red light) would be greater than a refraction angle of the light L having a short wavelength (such as a blue light). Therefore, the light L could be split through the meta units 150 to the photoelectric conversion layer 110. In addition, because the meta unit 150 has a T-shaped structure (the size of the top portion TP of the meta unit 150 is greater than the size of the bottom portion BP of the meta unit 150), the result of split light would be better than a meta unit having a column shape. As a result, the meta units 150 of the present disclosure could provide a better splitting result of the light L and could improve the image performance of the optical device 100.

In some embodiments, the refractive index of the meta units 150 is in a range from 1.4 to 6.5, such as 1.5, 2, 2.5, 3, 3.5, 4, 4.5, 5, 5.5, or 6. If the refractive index of the meta units 150 is less than 1.4 or greater than 6.5, it may not has the desired optical phenomena mentioned above. If the refractive index of the meta units 150 is less than the refractive index of the underlying layer 130, it may not has the desired optical phenomena mentioned above. If the refractive index of the meta units 150 is less than the refractive index of the anti-reflection layer 140, the anti-reflection layer 140 would increase the reflection of the light L.

Please refer to FIG. 1 again. Each size of the meta units 150 may be different from each other. For example, the size of the meta unit 150 above the photodiode 112b is greater (wider) than the size of the meta unit 150 above the photodiode 112c. The size of the meta unit 150 above the photodiode 112a is greater (wider) than the size of the meta unit 150 above the photodiode 112c. The size of the meta unit 150 above the photodiode 112a, the size of the meta unit 150 above the photodiode 112b, and the size of the meta unit 150 above the DTI 114 are different from each other.

The spacings S between two central lines of any two adjacent meta units 150 is the same, as shown in FIG. 1. In some embodiment, the spacing S is less than a wavelength of the light L. In other embodiments, the spacings S between two central lines of any two meta units 150 are different. In some embodiments, there may be no any meta unit 150 above any one of the photodiodes 112a, 112b, 112c. The different sizes of different meta units 150 and the arrangement of the meta units 150 would cause different optical aberrations, and it could be adjusted according to the design and requirements of the optical device 100.

FIG. 3A, FIG. 4A, and FIG. 5 to FIG. 12 respectively are three-dimensional views of a meta unit 150a~150j according to alternative embodiments of the present disclosure. Each of the meta units 150a~150j could be the alternative examples of the meta unit 150 shown in FIG. 1. In other words, the meta units 150 shown in FIG. 1 could be replaced by any one of the meta units 150a~150j. In some embodiments, a shape of each of the meta units (including the meta units 150, 150a~150j) shown in FIG. 1 may include a round, a square, a rectangle, or combinations thereof in a top view (a D2-D3 plane). It is noticed that each size of the top portion TP of any one of the meta unit 150a~150j is greater than each size of the bottom portion BP of any one of the meta unit 150a~150j.

Figure 3B:
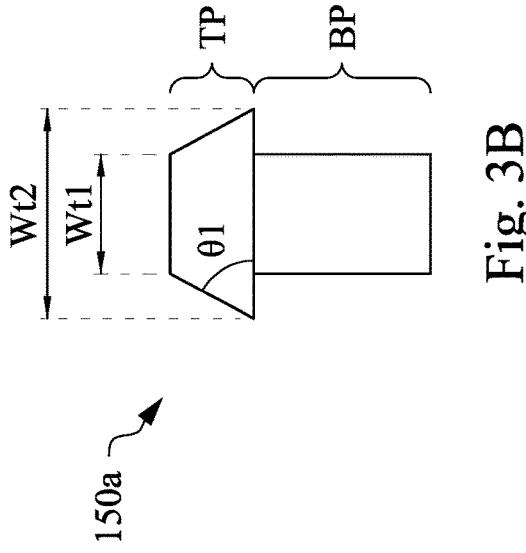
FIG. 3B is a side view of the meta unit of FIG. 3A.
Figure 3A:
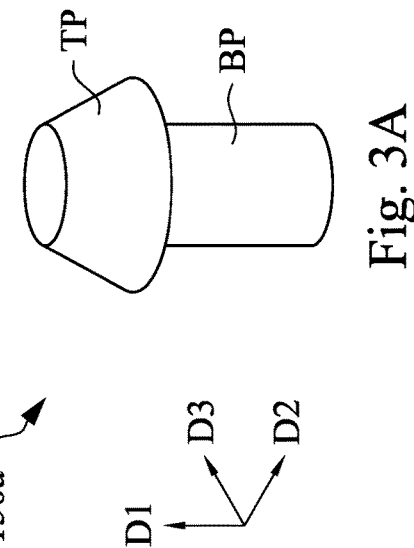
FIG. 3A, FIG. 4A, and FIG. 5 to FIG. 12 respectively are three-dimensional views of a meta unit according to alternative embodiments of the present disclosure.

Please refer to FIG. 3A and FIG. 3B. FIG. 3B is a side view of the meta unit 150a of FIG. 3A. As shown in FIG. 3B, a shape of the top portion TP of the meta unit 150a includes a trapezoid, and a first top width Wt1 of the trapezoid is less than a bottom width Wt2 of the trapezoid. Specifically, the top portion TP gradually increases in width from top to bottom. In some embodiments, a bottom angle θ1 of the trapezoid is in a range from 30 degrees to 90 degrees, such as 45, 60, or 75 degrees.

Figure 4B:
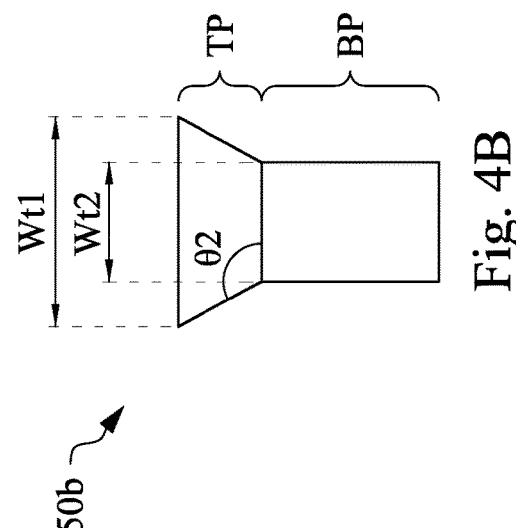
FIG. 4B is a side view of the meta unit of FIG. 4A.
Figure 4A:
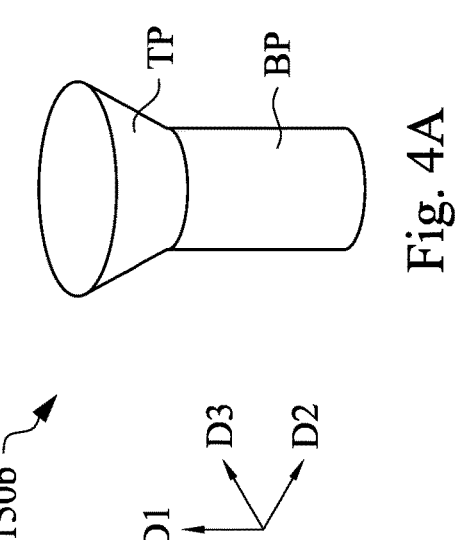

Please refer to FIG. 4A and FIG. 4B. FIG. 4B is a side view of the meta unit 150b of FIG. 4A. As shown in FIG. 4B, a shape of the top portion TP of the meta unit 150b includes a trapezoid, and a first top width Wt1 of the trapezoid is greater than a second top width Wt2 of the trapezoid. Specifically, the top portion TP gradually decreases in width from top to bottom. In some embodiments, a bottom angle θ2 of the trapezoid is in a range from 90 degrees to 135 degrees, such as 100, 110, 120, or 130 degrees. As shown in FIG. 3A and FIG. 4A, the shapes of the meta units 150a, 150b are round in top views or bottom views (D2-D3 planes).

Figure 5:
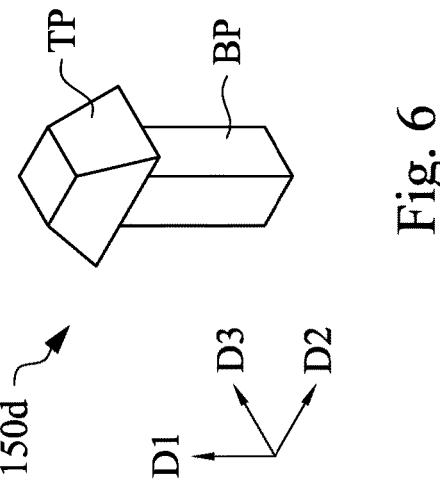
Figure 6:
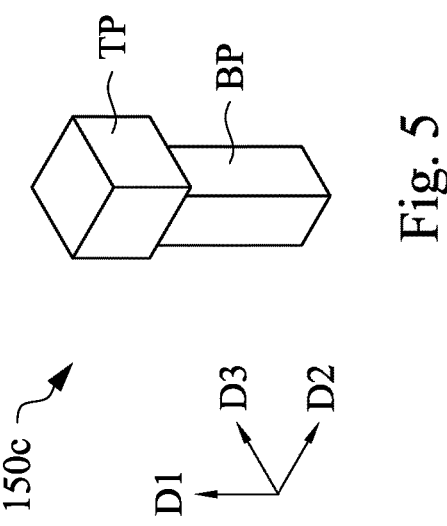

As shown in FIG. 5, both shapes of the top portion TP and the bottom portion BP of the meta unit 150c are square in the top view or the bottom view. As shown in FIG. 6, both shapes of the top portion TP and the bottom portion BP of the meta unit 150d are square in the top view or the bottom view. The meta unit 150d has a trapezoid in a side view (a D1-D2 plane or a D1-D3 plane). In other words, the meta unit 150d has a trapezoid in the side view.

Figure 7:
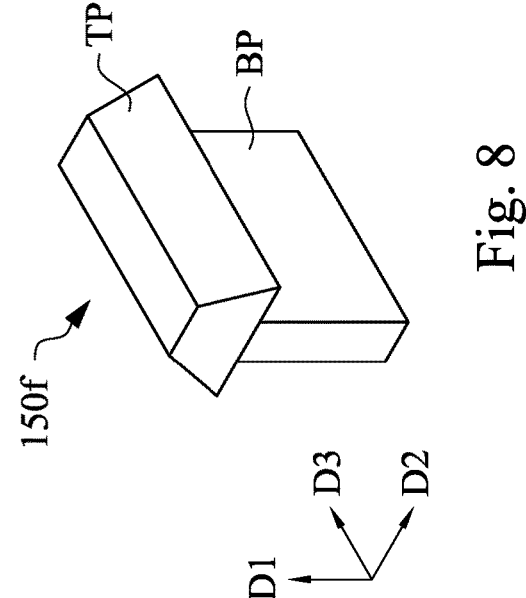
Figure 8:
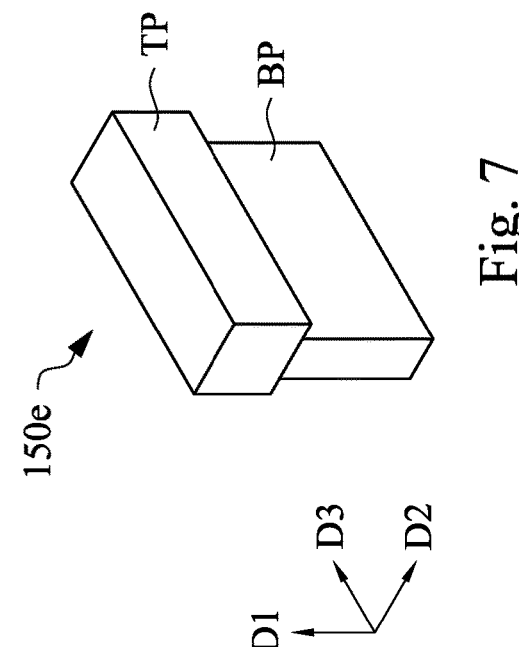

As shown in FIG. 7, both shapes of the top portion TP and the bottom portion BP of the meta unit 150e are rectangle in the top view or the bottom view. As shown in FIG. 8, both shapes of the top portion TP and the bottom portion BP of the meta unit 150f are rectangle in the top view or the bottom view. The meta unit 150f has a trapezoid in the side view (the D1-D2 plane or the D1-D3 plane). In other words, the meta unit 150f has a trapezoid in the side view.

Figure 10:
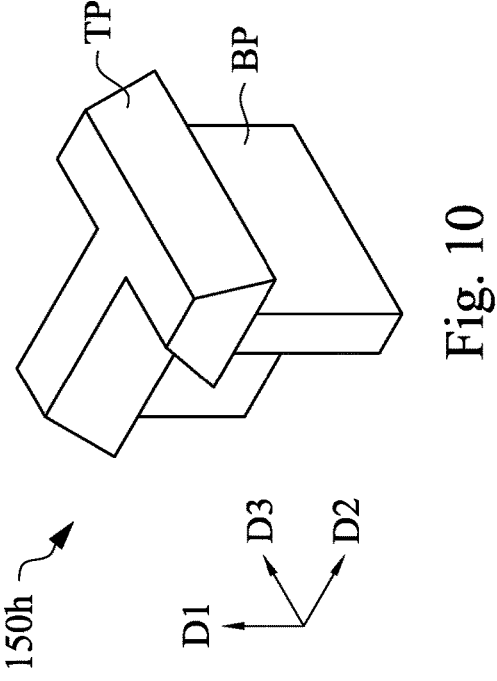
Figure 9:
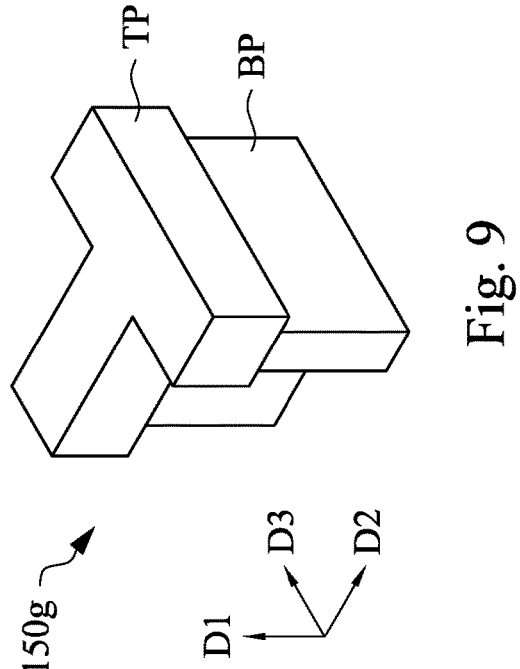

As shown in FIG. 9, both the top portion TP and the bottom portion BP of the meta unit 150g have T-shapes in the top view or the bottom view, and the T-shape of the top portion TP is greater than the T-shape of the bottom portion BP. As shown in FIG. 10, both the top portion TP and the bottom portion BP of the meta unit 150h have T-shapes in the top view or the bottom view, and the T-shape of the top portion TP is greater than the T-shape of the bottom portion BP. The meta unit 150h includes a trapezoid in the side view (the D1-D2 plane or the D1-D3 plane).

Figure 12:
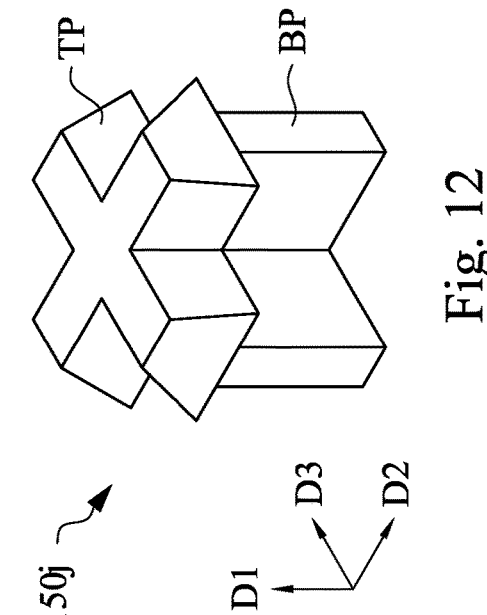
Figure 11:
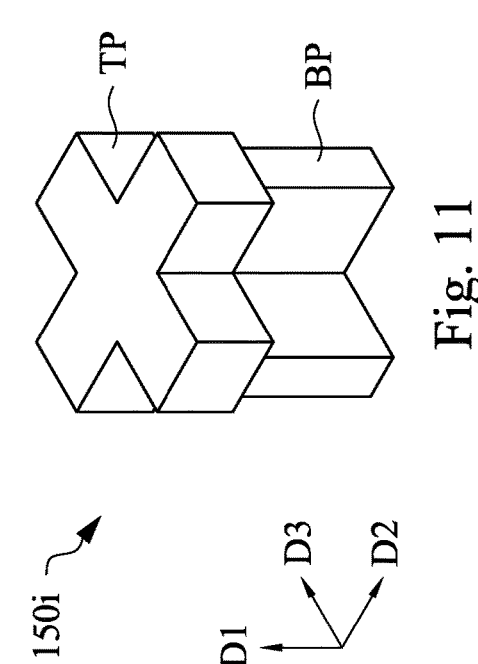

As shown in FIG. 11, both the top portion TP and the bottom portion BP of the meta unit 150i have cross-shapes in the top view or the bottom view, and the cross-shape of the top portion TP is greater than the cross-shape of the bottom portion BP in the top view. As shown in FIG. 12, both the top portion TP and the bottom portion BP of the meta unit 150j have cross-shapes in the top view or the bottom view. The meta unit 150j includes a trapezoid in the side view (the D1-D2 plane or the D1-D3 plane).

FIG. 13 is cross-sectional views of arrangements of the meta units 150 according to alternative embodiments of the present disclosure. Each size of the meta units 150 is the same as each other and each of the meta units 150 is spaced from each other. Similarly, the top portion TP of the meta unit 150 is embedded in a lower portion of the anti-reflection layer 140, and the bottom portion BP of the meta unit 150 is embedded in an upper portion of the underlying layer 130.

FIG. 14 and FIG. 15 are cross-sectional views of arrangements of the meta units 150 according to alternative embodiments of the present disclosure. The top portions TP (please refer to FIG. 1) of different meta units 150 are connected together to form a continuous top portion 151, and the bottom portions BP of different meta units 150 are protruded from the continuous top portion 151, so that the meta units 150 has a comb shape. Specifically, the continuous top portion 151 is disposed between the underlying layer 130 and the anti-reflection layer 140. Each size of the bottom portions BP of the meta units 150 is the same as each other, as shown in FIG. 14. Each size of the bottom portions BP of the meta units 150 is different from each other, as shown in FIG. 15.

Figure 17:
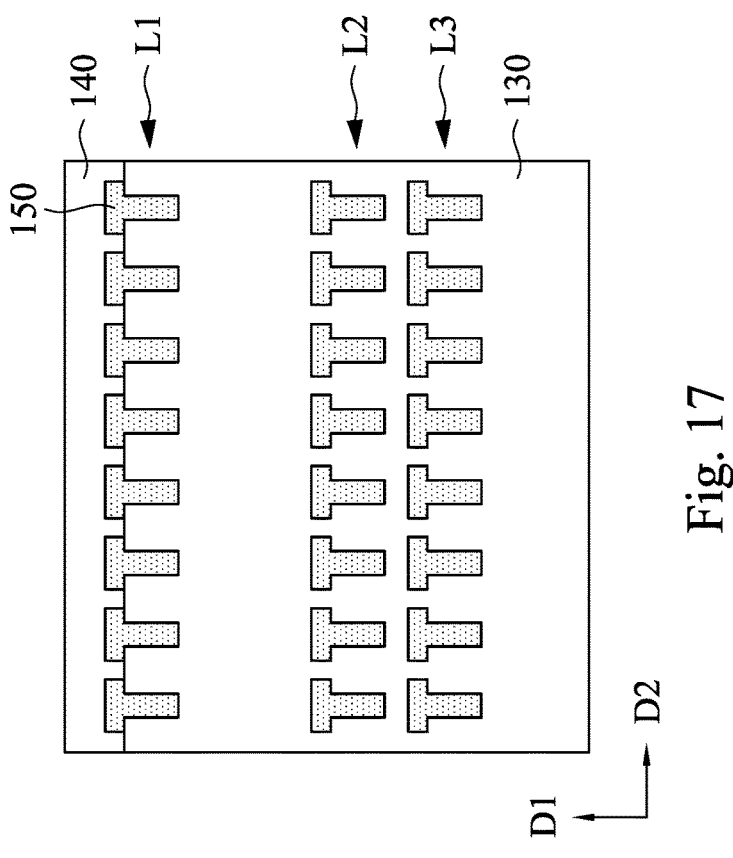
Figure 16:
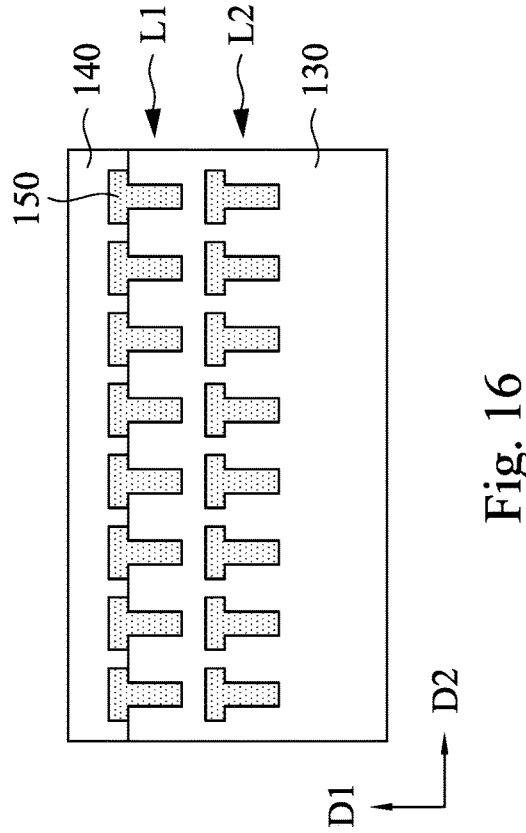

FIG. 16 and FIG. 17 are cross-sectional views of arrangements of the meta units 150 according to alternative embodiments of the present disclosure. As shown in FIG. 16, the plurality of meta units are arranged in two layers (a first layer L1 and a second layer L2), and the second layer L2 is completely embedded in the underlying layer 130. As shown in FIG. 17 the plurality of meta units are arranged in three layers (a first layer L1, a second layer L2, and a third layer L3), and the third layer L3 is completely embedded in the underlying layer 130.

Figure 19:
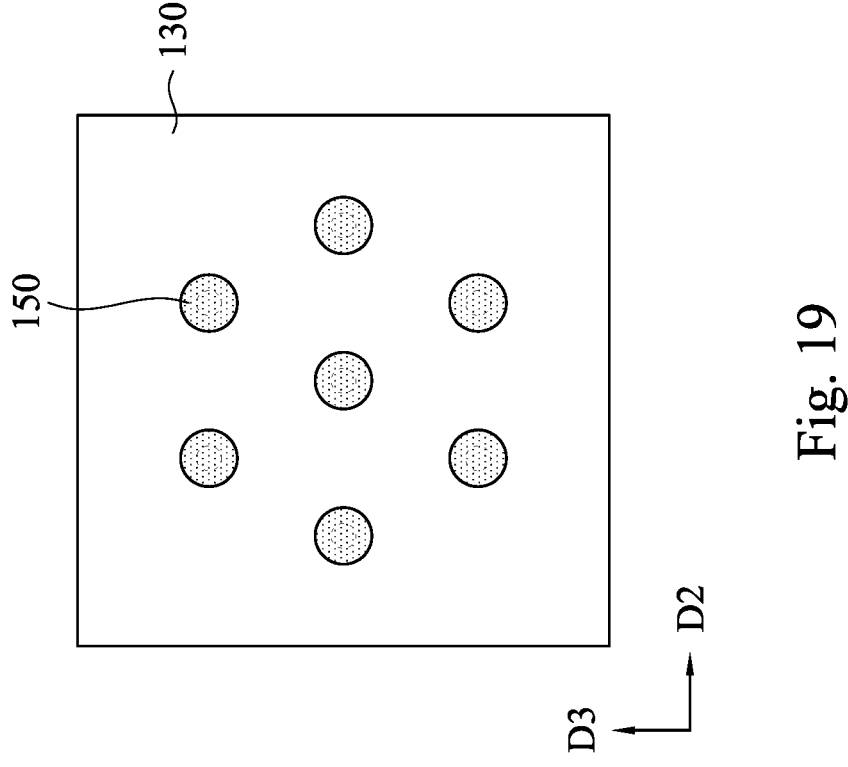
FIG. 18 to FIG. 21 are top views of arrangements of meta units according to some embodiments of the present disclosure.
Figure 18:
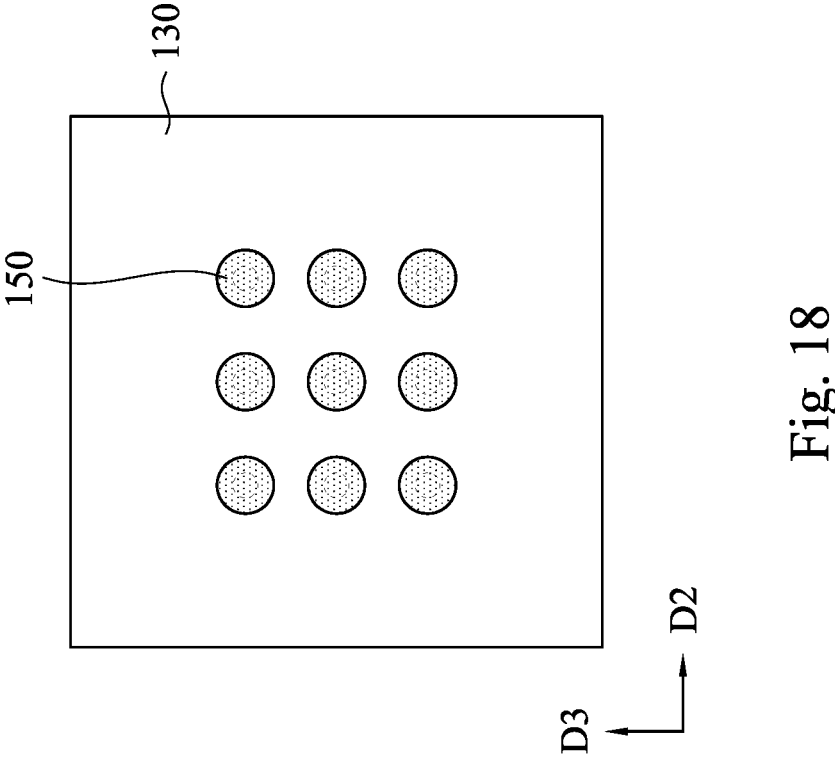
Figure 21:
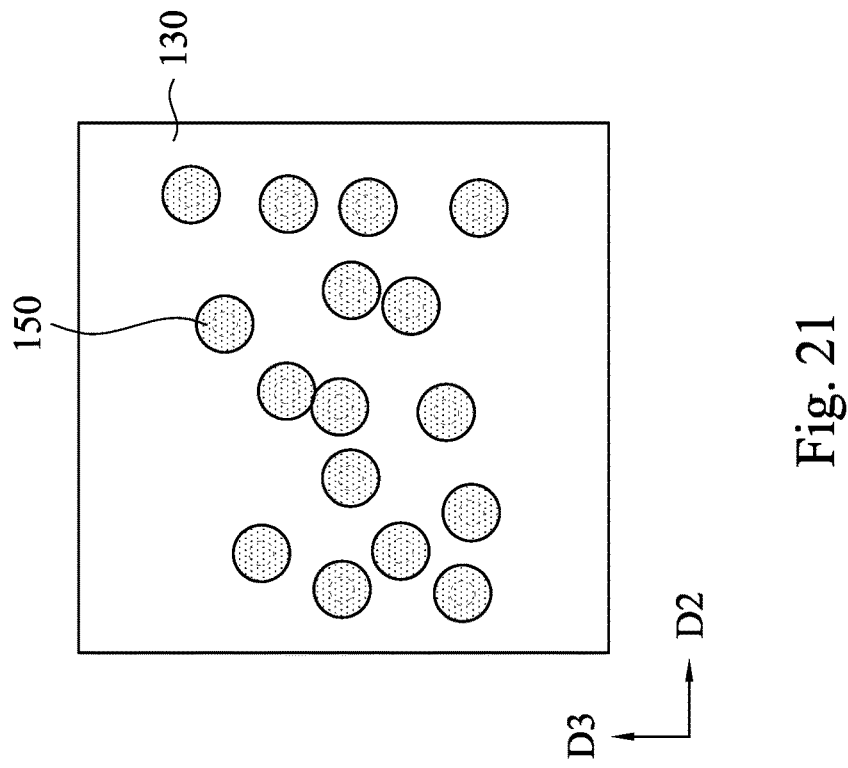
Figure 20:
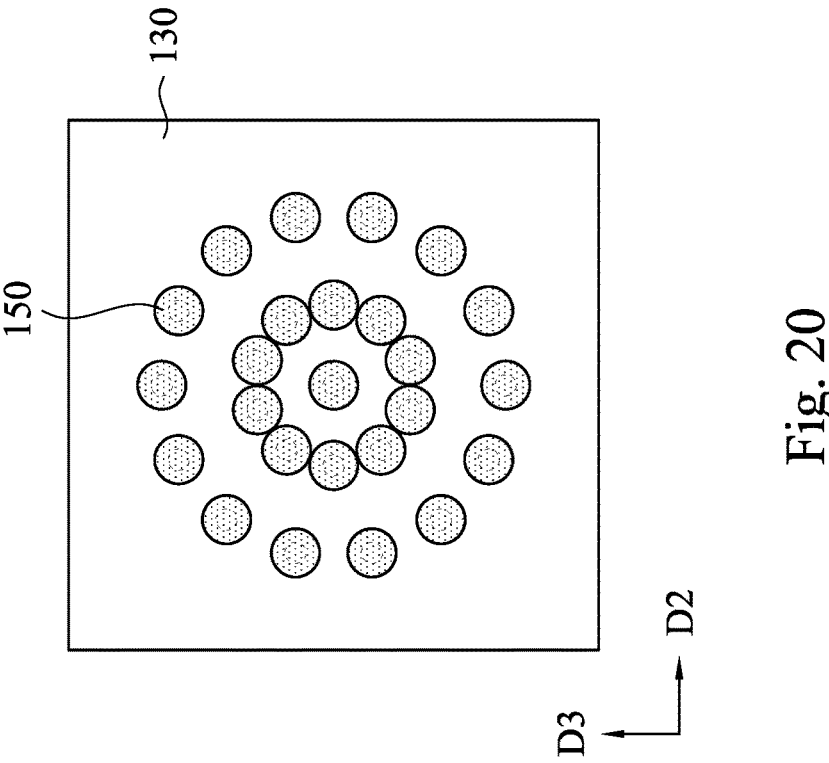

FIG. 18 to FIG. 21 are top views of arrangements of the meta units 150 according to some embodiments of the present disclosure. The meta units 150 may be arranged in a form of a matrix array, as shown in FIG. 18. The meta units 150 may be arranged in a form of a polygonal array, such as a hexagonal array, as shown in FIG. 19. The meta units 150 may be arranged in a form of a concentric array, as shown in FIG. 20. The meta units 150 may be arranged in a form of a random, as shown in FIG. 18. The arrangement of the meta units 150 could be adjusted according to the design and requirements of the optical devices.

Figure 22:
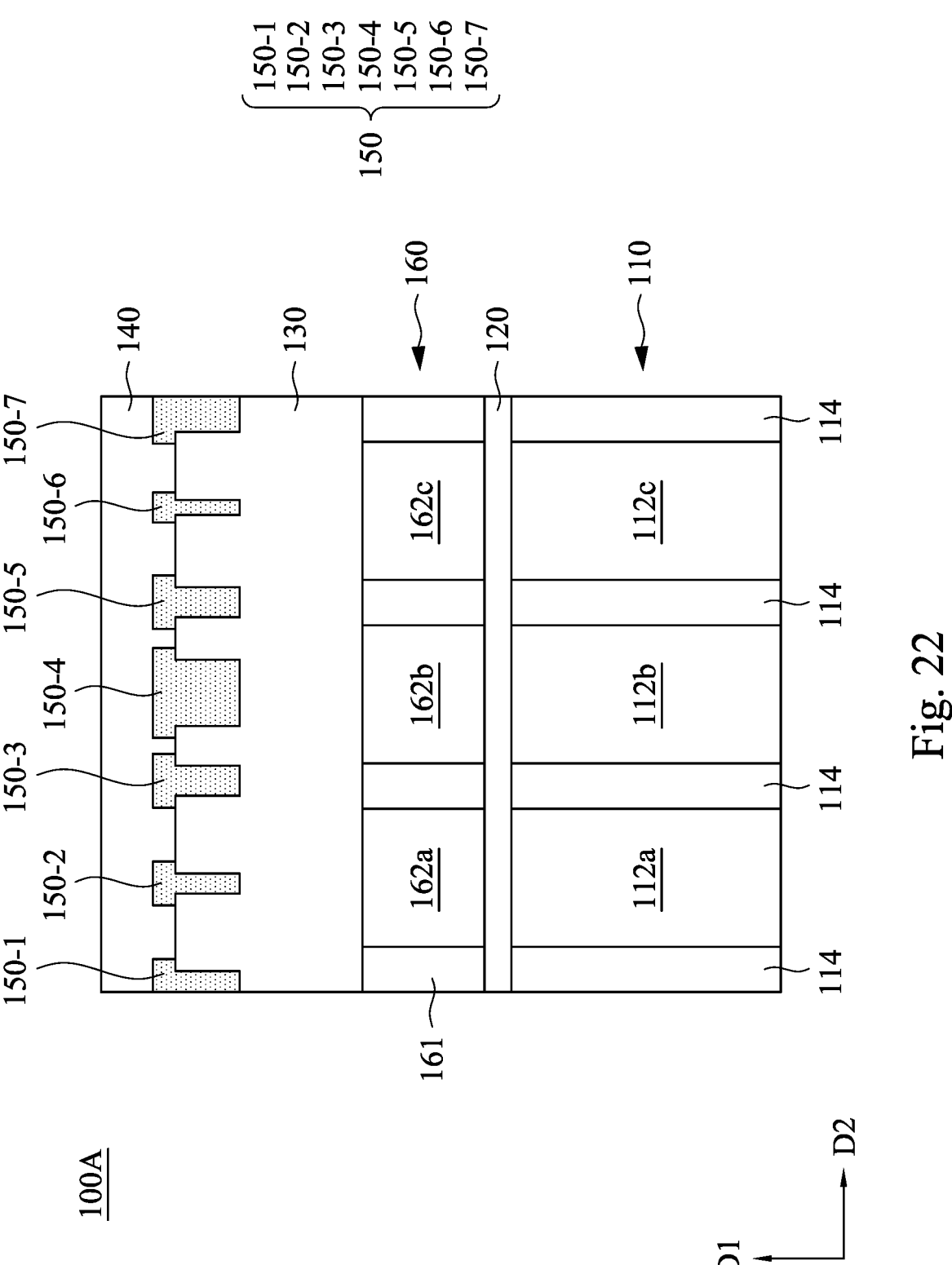
FIG. 22 is a cross-sectional view of an optical device in accordance with some embodiments of the present disclosure.

FIG. 22 is a cross-sectional view of an optical device 100A in accordance with some embodiments of the present disclosure. The difference between the optical device 100A of FIG. 22 and the optical device 100 of FIG. 1 is a color filter layer 160, with same features being labeled by same numerical references, and descriptions of the same features are not repeated herein. The meta units 150 includes the meta units 150-1, 150-2, 150-3, 150-4, 150-5, 150-6, 150-7. The color filter layer 160 is disposed between the photoelectric conversion layer 110 and the underlying layer 130. The color filter layer 160 is disposed on the buffer layer 120. The color filter layer 160 includes a plurality of grids 161 and a plurality of color filters 162a, 162b, 162c. The grids 161 separate the color filters 162a, 162b, 162c.

Still refer to FIG. 22. The meta unit 150-2 corresponds to the color filter 162a and the photodiode 112a, the meta unit 150-4 corresponds to the color filter 162b and the photodiode 112*b*, and the meta unit 150-6 corresponds to the color filter 162*c* and the photodiode 112*c*. The meta units 150-1, 150-3, 150-5, 150-7 correspond to the grids 161 and the DTIs 114. Therefore, a projection of the meta units 150 (including the meta units 150-1~150-7) on the photoelectric conversion layer 110 partially overlaps a projection of the grids 161 on the photoelectric conversion layer 110. Specifically, the projection of the meta units 150-1, 150-3, 150-5, 150-7 on the photoelectric conversion layer 110 overlaps the projection of the grids 161 on the photoelectric conversion layer 110. The color filter layer 160 are arranged in an array and may include RGB filters, RGBW filters, RGBC filters, RYYB filters, CMY filters, or other combination filters. For examples, the color filter 162*a* may be a red filter, the color filter 162*b* may be a green filter, and the color filter 162*c* may be a blue filter.

Figures 23A, 23B:
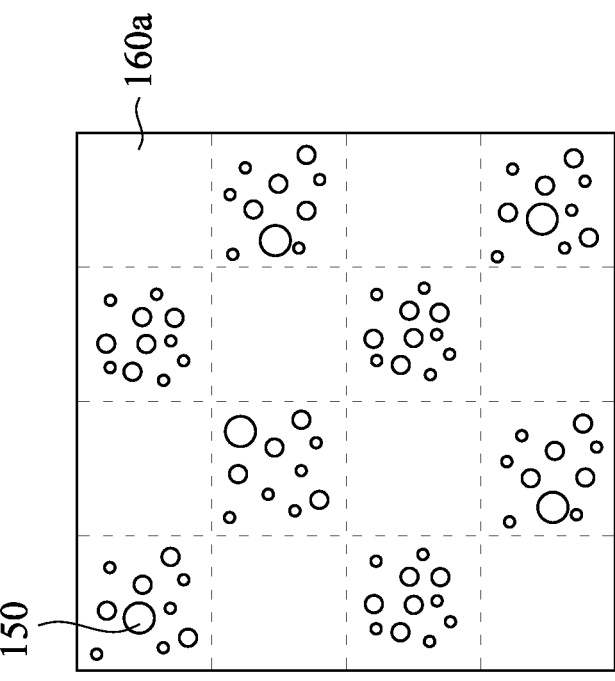
FIG. 23A is a top view of a color filter layer in accordance with some embodiments of the present disclosure.
FIG. 23B is a top view of an arrangement of meta units above the color filter layer of FIG. 23A.

FIG. 23A is a top view of the color filter layer 160*a* in accordance with some embodiments of the present disclosure. The color filter layer 160*a* is an array of RGBW filters. FIG. 23B is a top view of an arrangement of the meta units 150 above the color filter layer 160*a* of FIG. 23A, in which some elements are not illustrated for clarity. As shown in FIG. 23A, and FIG. 23B, the meta units 150 are only disposed above the RGB filters, and there is no any meta units 150 disposed above the W filters. The meta units 150 in each of the R filters, G filters, and B filters are in random arrangements.

Figure 24:
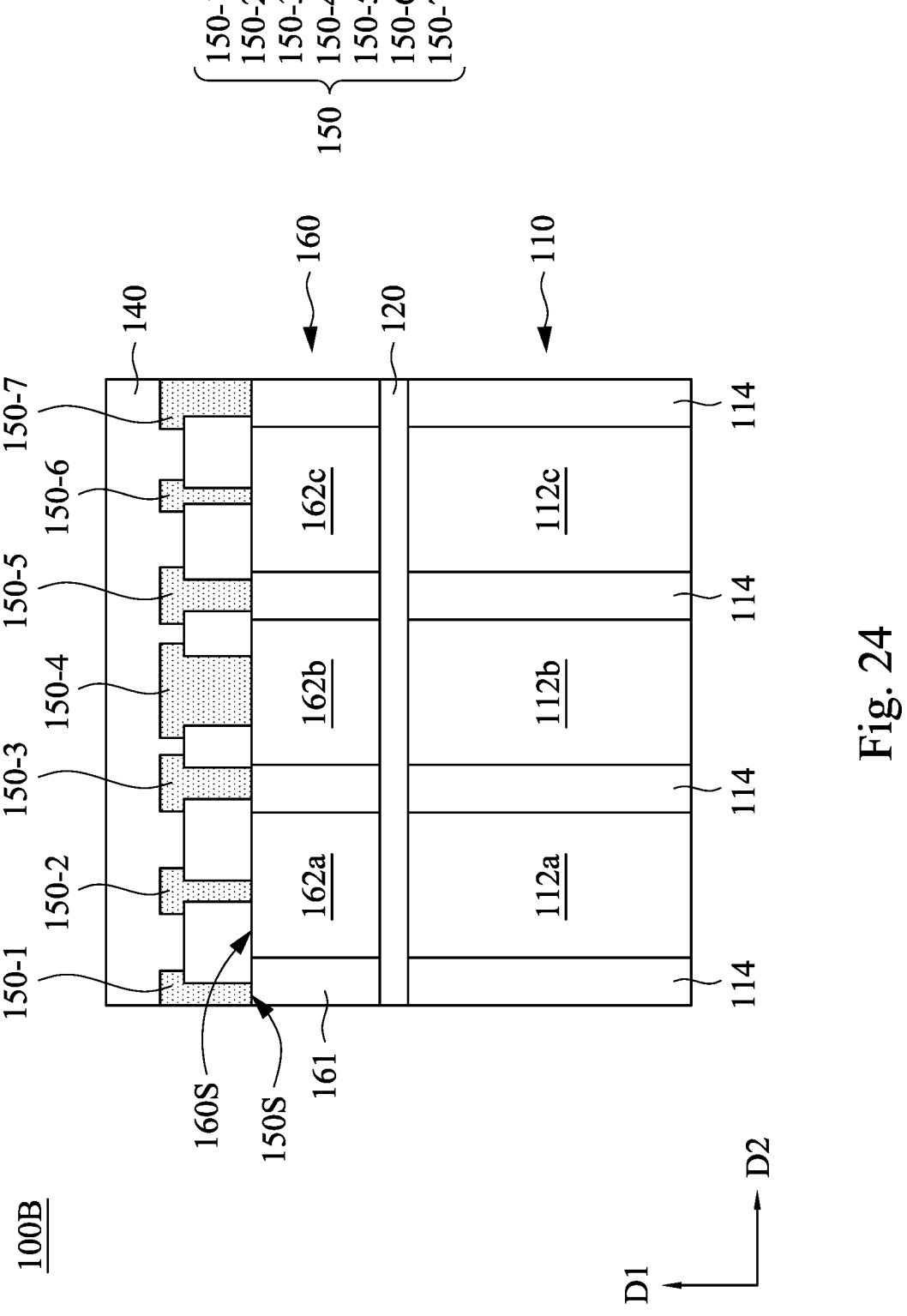
FIG. 24 to FIG. 26 are cross-sectional views of optical devices in accordance with some embodiments of the present disclosure.

FIG. 24 is a cross-sectional view of an optical device 100B in accordance with some embodiments of the present disclosure. The difference between the optical device 100B of FIG. 24 and the optical device 100A of FIG. 22 is the thickness of the underlying layer 130. Specifically, the bottom surface 150S of each of the meta units 150 contacts a top surface 160S of the color filter layer 160.

Figure 25:
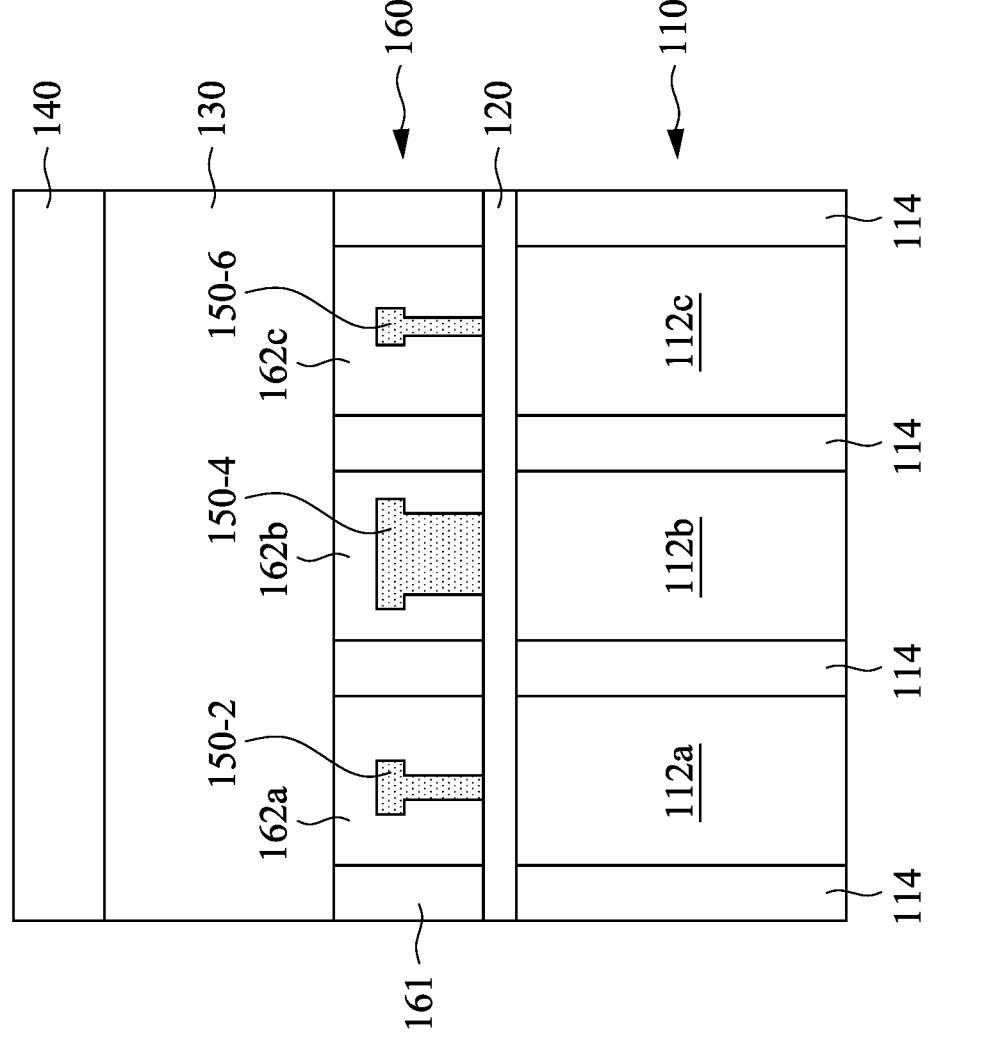

FIG. 25 is a cross-sectional view of an optical device 100C in accordance with some embodiments of the present disclosure. The difference between the optical device 100C of FIG. 25 and the optical device 100A of FIG. 22 is the positions of the meta units 150 and the amount of the meta units 150. Specifically, the meta units 150-2, 150-4, 150-6 are embedded in the color filter layer 160. More specifically, the meta unit 150-2 is embedded in the color filter 162*a*, the meta unit 150-4 is embedded in the color filter 162*b*, and the meta unit 150-6 is embedded in the color filter 162*c*. Since the meta units 150 (the meta units 150-2, 150-4, 150-6) are spaced apart from the grids 161, a projection of the meta units 150 (the meta units 150-2, 150-4, 150-6) on the photoelectric conversion layer 110 is spaced apart from a projection of the grids 161 on the photoelectric conversion layer 110.

Figure 26:
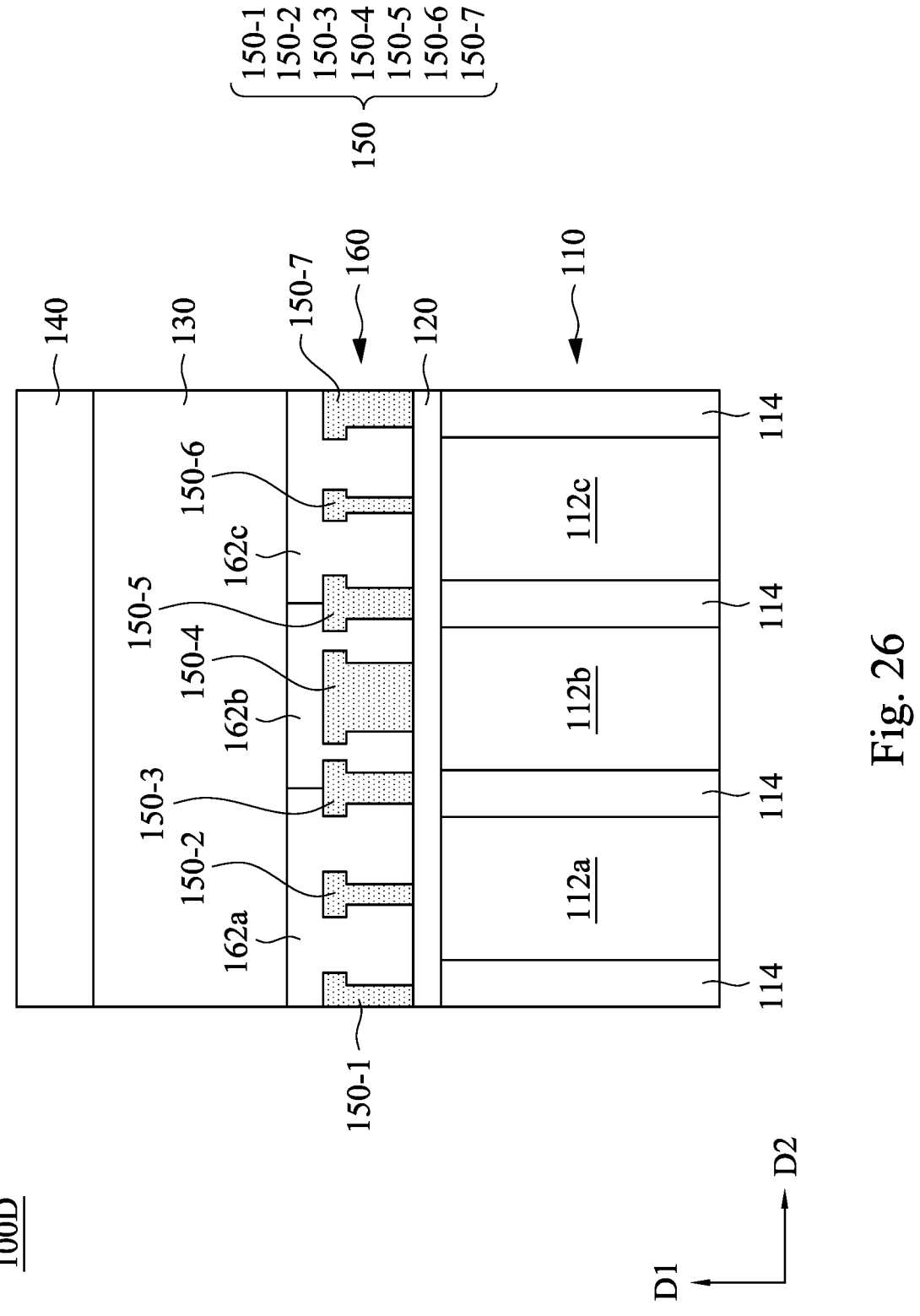

FIG. 26 is a cross-sectional view of an optical device 100D in accordance with some embodiments of the present disclosure. The difference between the optical device 100D of FIG. 26 and the optical device 100C of FIG. 25 is the grids 161 and the amount of the meta units 150. Specifically, the grids 161 of the color filter layer 160 in the optical device 100C are replaced by the meta units 150-1, 150-3, 150-5, 150-7. The meta unit 150-2 remains in the color filter 162*a*, the meta unit 150-4 remains in the color filter 162*b*, and the meta unit 150-6 remains in the color filter 162*c*. The meta unit 150-3 is disposed in a boundary of the color filter 162*a* and the color filter 162*b*, and the meta unit 150-5 is disposed in a boundary of the color filter 162*b* and the color filter 162*c*.

The optical devices of the present disclosure have a plurality of meta units embedded therein. Each of the meta units has the top portion and the bottom portion, and the surface area of the top portion is greater than the surface area of the bottom portion. The meta units of the present disclosure could provide better optical aberrations and improve the image performance of the optical devices.

The present disclosure has been disclosed as hereinabove, however it is not used to limit the present disclosure. Those skilled in the art may make various changes, substitutions, and alterations herein without departing from the spirit and scope of the present disclosure. Therefore, the scope of protection of the present disclosure shall be subject to the scope of the claim attached in the application and its equivalent constructions.

What is claimed is:

1. An optical device, comprising:
a photoelectric conversion layer;
an underlying layer disposed on the photoelectric conversion layer;
an anti-reflection layer disposed on the underlying layer; and
a plurality of meta units disposed above the photoelectric conversion layer, wherein each of the plurality of meta units comprises a top portion and a bottom portion, a projection of the bottom portion on the photoelectric conversion layer is less than a projection of the top portion on the photoelectric conversion layer, and a specific value of a top height of the top portion to a bottom height of the bottom portion is in a range from ¼ to ½, wherein the top portion has a flat top surface, a material of the top portion is the same as a material of the bottom portion, a refractive index of the plurality of meta units is greater than a refractive index of the underlying layer, and the refractive index of the underlying layer is greater than a refractive index of the anti-reflection layer,
wherein the photoelectric conversion layer comprises a first photodiode, the meta units comprise a first meta unit disposed above the first photodiode, and the first photodiode is associated with only the first meta unit.

2. The optical device of claim 1, wherein the top portion of each of the plurality of meta units is embedded in the anti-reflection layer and the bottom portion of each of the plurality of meta units is embedded in the underlying layer.

3. The optical device of claim 1, wherein a shape of the top portion of each of the plurality of meta units comprises a rectangle in a side view, a shape of the bottom portion of each of the plurality of meta units comprises a rectangle in a side view, and a top width of the top portion is greater than a bottom width of the bottom portion.

4. The optical device of claim 1, wherein projections of each of the plurality of meta units on the photoelectric conversion layer are spaced apart from each other.

5. The optical device of claim 1, wherein the top portions of the plurality of meta units are connected together to form a continuous top portion.

6. The optical device of claim 1, wherein a shape of each of the plurality of meta units comprises a round, a square, or a rectangle in a top view, and a shape of the top portion of each of the plurality of meta units comprises a rectangle or a trapezoid in a side view.

7. The optical device of claim 1, wherein a shape of each of the plurality of meta units comprises a T-shape or a cross-shape in a top view, and a shape of the top portion of each of the plurality of meta units comprises a trapezoid in a side view.

8. The optical device of claim 1, wherein a shape of the top portion of each of the plurality of meta units comprises a trapezoid in a side view, a first top width of the trapezoid is less than a second top width of the trapezoid, and a bottom angle of the trapezoid in a range from 30 degrees to 90 degrees.

9. The optical device of claim 1, wherein a shape of the top portion of each of the plurality of meta units comprises a trapezoid in a side view, a first top width of the trapezoid is greater than a second top width of the trapezoid, and a bottom angle of the trapezoid in a range from 90 degrees to 135 degrees.

10. The optical device of claim 1, wherein the photoelectric conversion layer further comprises a second photodiode and a deep trench isolation disposed between the first photodiode and the second photodiode, the meta units further comprise a second meta unit disposed above the second photodiode and a third meta unit disposed above the deep trench isolation, and a size of the first meta unit, a size of the second meta unit, and a size of the third meta unit are different from each other.

11. The optical device of claim 1, wherein the meta units is made of two-dimensional transition metal dichalcogenides, $ZrO_2$, $TiO_2$, $Si_xN_y$, ITO, Si, a-Si, p-Si, a III-V semiconductor compound, or combinations thereof, wherein x and y are positive integers, x is in a range from 1 to 3, and y is in a range from 1 to 4.

12. The optical device of claim 1, wherein the plurality of meta units are arranged in two layers or three layers, and a bottommost layer of the meta units is completely embedded in the underlying layer.

13. The optical device of claim 1, wherein the plurality of meta units are arranged in a form of a matrix array, a polygonal array, a concentric circle, or random.

14. The optical device of claim 1, further comprising a color filter layer disposed between the photoelectric conversion layer and the underlying layer, wherein the top portion of each of the plurality of meta units is embedded in the anti-reflection layer and the bottom portion of each of the plurality of meta units is embedded in the underlying layer.

15. The optical device of claim 1, further comprising a color filter layer disposed between the photoelectric conversion layer and the underlying layer, wherein a bottom surface of each of the plurality of meta units contacts a top surface of the color filter layer.

16. The optical device of claim 1, further comprising a color filter layer disposed between the photoelectric conversion layer and the underlying layer, wherein the color filter layer comprises a plurality of grids and a plurality of color filters, and a projection of the plurality of meta units on the photoelectric conversion layer partially overlaps a projection of the plurality of grids on the photoelectric conversion layer.

17. The optical device of claim 1, further comprising a color filter layer disposed between the photoelectric conversion layer and the underlying layer, wherein the plurality of meta units are embedded in the color filter layer.

18. The optical device of claim 1, further comprising a color filter layer disposed between the photoelectric conversion layer and the underlying layer, wherein the color filter layer comprises a plurality of grids and a plurality of color filters, and a projection of the plurality of meta units on the photoelectric conversion layer is spaced apart from a projection of the plurality of grids on the photoelectric conversion layer.

19. The optical device of claim 1, wherein the refractive index of the plurality of meta units is in a range from 1.4 to 6.5.

20. The optical device of claim 1, wherein a bottom surface of the anti-reflection layer is in contact with a top surface of the underlying layer.

* * * * *